United States Patent [19]
Tanizawa

[11] Patent Number: 4,739,386
[45] Date of Patent: Apr. 19, 1988

[54] BIPOLAR TRANSISTOR HAVING IMPROVED SWITCHING TIME

[75] Inventor: Tetsu Tanizawa, Kawasaki, Japan

[73] Assignee: Fujitsu Limited, Kawasaki, Japan

[21] Appl. No.: 932,287

[22] Filed: Nov. 19, 1986

[30] Foreign Application Priority Data

Nov. 19, 1985 [JP] Japan ................................ 60-259395

[51] Int. Cl.⁴ ............................................. H01L 29/72
[52] U.S. Cl. ......................................... 357/34; 357/43; 357/46; 357/22; 357/86
[58] Field of Search .................... 357/34, 43, 46, 22 G, 357/86, 23.4, 22 D, 22 V

[56] References Cited

U.S. PATENT DOCUMENTS

| | | | |
|---|---|---|---|
| 4,095,252 | 6/1978 | Ochi | 357/34 |
| 4,143,392 | 3/1979 | Mylroie | 357/34 |
| 4,337,474 | 6/1982 | Yukimoto | 357/22 G |
| 4,613,887 | 9/1986 | Fukuda | 357/43 |
| 4,689,651 | 8/1987 | Hanna | 357/34 |

FOREIGN PATENT DOCUMENTS

| | | | |
|---|---|---|---|
| 56-153775 | 11/1981 | Japan | 357/34 |
| 57-39572 | 3/1982 | Japan | 357/86 |

OTHER PUBLICATIONS

IBM Technical Disclosure Bulletin, vol. 15, #9, Feb. 1973, by Lewis.

Primary Examiner—Andrew J. James
Assistant Examiner—Mark Prenty
Attorney, Agent, or Firm—Staas & Halsey

[57] ABSTRACT

Switching off time of a bipolar transistor is improved. When the bipolar transistor is driven to a saturation condition, the collector voltage does not go up rapidly when it is switched off again, because once the collector voltage is much less than the base voltage, reverse injection occurs, so the collector voltage can not follow the base voltage until the reverse injected electrons are swept out. In order to avoid saturation, a vertical FET is provided between the base and collector of the bipolar transistor to clamp the base-collector voltage. The channel region of the vertical transistor is formed between the base contact region and collector region of the transistor. Thus, when the transistor is in a non-saturation state, the channel is closed by built in potential, but when the transistor approaches the saturation state, the channel automatically opens to shunt between the base and collector of the bipolar transistor. By replacing a Shottky barrier diode used in prior art circuits for such purposes, with a vertical FET, the device becomes more resignable, and fabrication process is simplified.

5 Claims, 3 Drawing Sheets

BIPOLAR TRANSISTOR HAVING IMPROVED SWITCHING TIME

BACKGROUND OF THE INVENTION

The present invention relates to a bipolar transistor in which switching time, especially switch off time is improved, avoiding a saturation condition by providing a vertical channel FET (field effect transistor) between base and collector.

It is said in general, that bipolar transistors have a faster switching speed compared to field effect transistors (FETs). It is true unless the bipolar transistor is driven to its saturation condition. But if the bipolar transistor is driven to its saturation state, the switching time, especially $T_{off}$ (the switching time to switch from an ON to an OFF state) increases.

FIG. 1 shows saturation characteristic of an ordinary emitter grounded bipolar transistor. In the figure, the ordinate shows the collector-emitter voltage $V_{CE}$ or base-emitter voltage $V_{BE}$ of a npn transistor, and the abscissa shows time. First, (t=0) $V_{BE}$ is low, so the transistor is cut off and $V_{CE}$ is high, and the base-collector junction is reversely biased. As the base voltage $V_{BE}$ goes up, the collector current begins to flow and the collector voltage $V_{CE}$ decreases by voltage drop due to the load of the collector. When the base voltage reaches $V_{BE}$(on) a base current flows as a forward biased diode. The base voltage is clamped but the collector voltage further decreases until it reaches to a saturation voltage $V_{CE}$ (sat). At this state, the collector voltage becomes lower than the base voltage, so the base-collector voltage $V_{BC}$ becomes a forward bias and electrons are reversely injected from the collector to the base.

In such a situation, the electrons injected from the collector are accumulated in the base region. If the base voltage is decreased again to make the transistor OFF, the collector voltage does not respond immediately, because the electrons accumulated in the base region must be swept out. Namely, as shown in FIG. 1, when the base voltage is pulled down, the collector voltage begins to go up after a response time ΔT, during which the reverse injected electrons are swept off. So, the switching off time $T_{off}$ of the bipolar transistor becomes longer than its switching on time $T_{on}$ by a factor of from ten to a hundred when it is driven to the saturation condition.

The response time ΔT in the switching off operation is inherent in the bipolar transistors, so, the high speed logic circuits avoid the saturation condition of the bipolar transistors. One attempt is emitter coupled logic (ECL) which supplies a bias voltage to the base to avoid saturation. Another attempt is to clamp the collector voltage not to swing to the saturation voltage by inserting a diode, especially a Schottky barrier diode.

FIG. 2 is an equivalent circuit diagram of a bipolar transistor which is provided with a Schottky barrier diode (SBD) between base and collector electrodes. Inserting the Schottky barrier diode, the base-collector voltage $V_{BC}$ is clamped to a Shottky voltage $V_{SBD}$ determined by the Shottky barrier, and it cannot decrease further as shown by the broken line in FIG. 1. $V_{SBD}$ is smaller than $V_{BC}$, so the collector voltage does not decrease to $V_{CE}$(sat), and the reverse injection of electrons does not occur. Therefore, the collector voltage can respond quickly as shown by the broken line in the figure, and the response time ΔT can be avoided.

But characteristics of the Shottky barrier diode are determined by metals used to contact with the semiconductor and the impurity concentration of the semiconductor. Therefore, in order to obtain a desirable Shottky barrier voltage $V_{SBD}$ for clamping the collector voltage to prevent the reverse injection of electrons as described above, the kind of metal to be used as a contact to the semiconductor is limited. Moreover, the selection of the metal is further limited from fabrication condition. Its patterning must be easy, and its Ohmic contact and adhesive property to the semiconductor must be good. Ordinarily used metals for contact with the semiconductor, such as aluminum, cannot be applied for such purpose. Therefore, the design of the device is limited in the selection of metal, and fabrication of the Shottky barrier clamping diode is critical by the present-state-of-the-art.

SUMMARY OF THE INVENTION

The object of the present invention, therefore, is to provide a bipolar transistor in which the saturation condition is avoided by a means which is not limited by selection of material.

Another object of the present invention is to make designable the above mentioned means using ordinary materials and fabrication processes.

A further object of the present invention is to improve the switching off characteristics of a bipolar transistor.

The above objects are obtained by providing a vertical FET between a base and collector of a bipolar transistor. The Shottky barrier diode used in prior art devices is replaced by a vertical channel FET. The characteristics of vertical channel FET do not depend on the contact materials composing it, thus, it becomes designable to obtain the desirable characteristics.

The vertical channel FET used in the invention is designed so as to close its channel when the bipolar transistor is in an unsaturated condition, so it does not affect the operation of the bipolar transistor. But, when the bipolar transistor approaches its saturation condition, the channel of the vertical FET automatically opens to shunt between the base and collector of the bipolar transistor preventing the over swing of the collector voltage.

The vertical channel FET used in the invention does not need a special process for fabricating a Shottky barrier diode. It can be fabricated at the same time together with the bipolar transistor by ordinary processes. Moreover, the steps and photolithographic masks used for the fabrication are simplified or omitted compared to the fabrication process of prior art devices using Shottky barrier diodes.

These objects and advantages of the present invention will be apparent from the following description taken in connection with the accompanying drawings.

BRIEF DESCRIPTION OF THE DRAWINGS

FIG. 3 is a configuration of a bipolar transistor having a vertical channel FET according to the present invention for avoiding the saturation operation; wherein FIG. 3(a) is a cross sectional view; and FIG. 3(b) is a plan view of a pattern of diffusion regions which appears when the contact electrode and surface passivation layer are removed;

Throughout the drawings, the same reference numerals designate and identify the same or corresponding parts.

DESCRIPTION OF PREFERRED EMBODIMENTS

Figure 3:
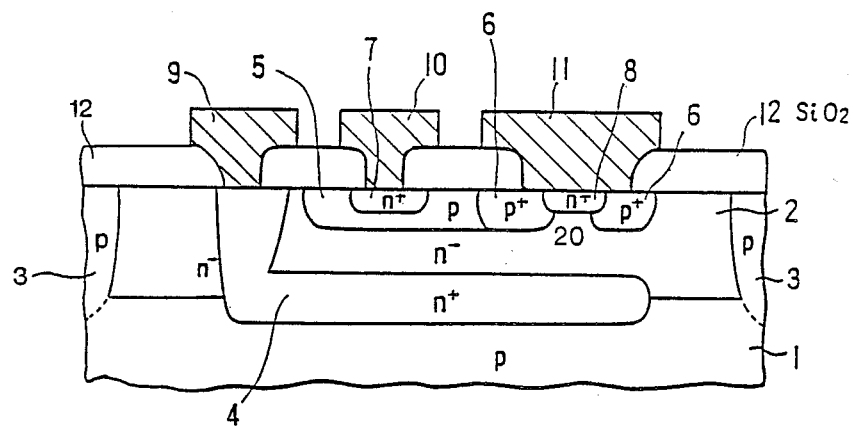
Figure 3:
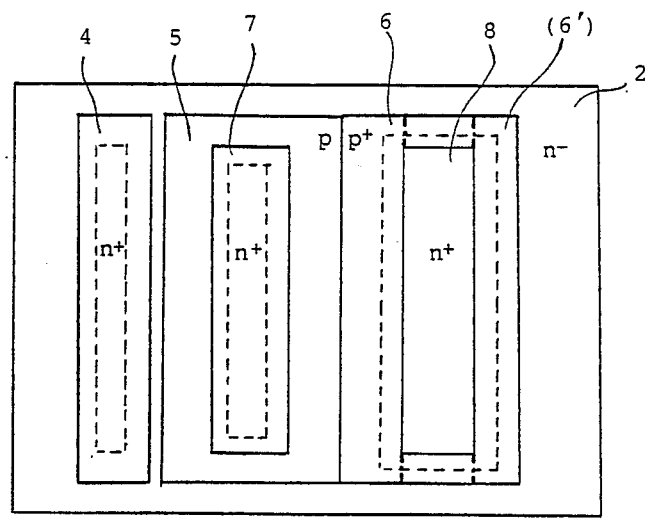

FIG. 3 is a configuration of a bipolar transistor according to the present invention to avoid the saturation operation. FIG. 3(a) is a cross section of the device, and FIG. 3(b) is a pattern of diffusion regions which may be seen when the electrodes and surface passivation layer are removed. In the figure, 1 is a p-type semiconductor substrate. It may be silicon or gallium arsenide, for example. An n$^-$-type collector layer 2 has sides of which are separated by a p-type isolation diffusion region 3. An n$^+$-type buried layer 4 is for collector contact. A p-type base layer 5, a p$^+$-type base contact region 6 and an n$^+$-type emitter layer 7 are also provided. The surface of the substrate is coated with an insulation film 12 which may be, for example, silicon dioxide ($SiO_2$). In the insulation layer 12 there are windows over which the collector electrode 9, emitter electrode 10 and base electrode 11 are formed, respectively. This is an ordinary configuration of a bipolar transistor.

As can be seen in FIG. 3(a), an n$^+$-type layer 8 is formed in the center part of the base contact layer 6. The thickness of this n$^+$-type layer 8 is smaller that that of the base contact region 6. As can be seen in the cross sectional view of FIG. 3(a), there is formed a vertical channel FET composed of the n$^+$-type layer 8, p$^+$-type 6 and n$^-$-type layer 2. The p$^+$-type layer 6, the n$^-$-type layer 2 and the n$^+$-type layer 8 operate respectively as the gate, source and drain of the vertical channel FET, and the n$^-$-type layer beneath the n$^+$-type layer 8 and between the opening of the p$^+$-type layer 6 operates as the channel region 20 of the vertical FET. The width of the opening in the p$^+$-type base contact region 6 is designed so as to be the channel of the vertical FET and is closed by a built in potential. The base contact electrode 11 (which is made of aluminum, for example) for the bipolar transistor is formed also over the n$^+$-type layer 8 as a drain electrode of the vertical FET. So, the vertical FET shunts between the collector 2 and base 5 of the bipolar transistor. The broken lines in FIG. 3(b) indicate the opening of the insulation layer 12 for respective contact electrodes.

Figure 4:
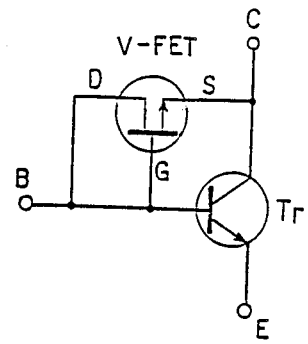
FIG. 4 is an equivalent circuit of the device in FIG. 3.

An equivalent circuit of the device of FIG. 3 becomes as shown in FIG. 4. The vertical channel FET (abbreviated as V-FET) is formed between the base and collector of the bipolar transistor Tr. The drain D and gate G of the V-FET are connected to the base B of the bipolar transistor, and the source S of the V-FET is connected to the collector C of the bipolar transistor Tr. This vertical channel FET operates as a saturation controller of the bipolar transistor.

Figure 1:
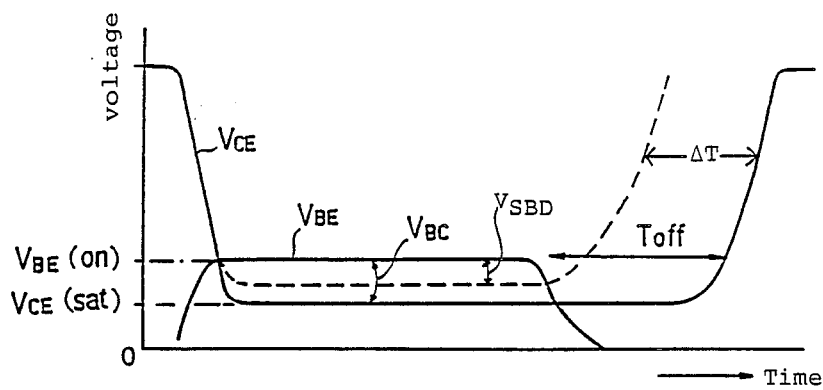
FIG. 1 is a graph of the switching characteristics of an ordinary bipolar transistor when it is driven to a saturation condition.
Figure 2:
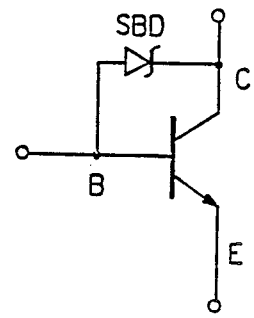
FIG. 2 is an equivalent circuit diagram of a prior art bipolar transistor having a Shottky barrier diode for avoiding the saturation operation.
Figure 5:
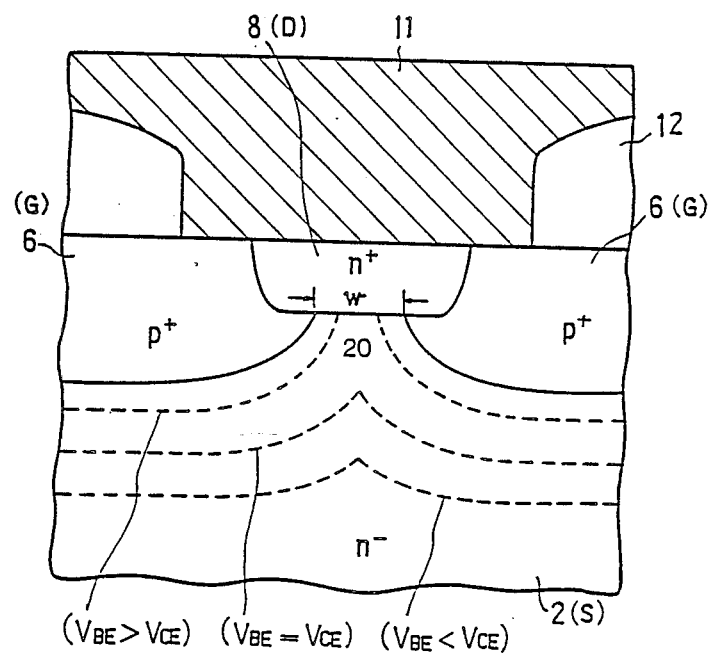
FIG. 5 is a partially enlarged diagram of an operation of the vertical channel FET in FIG. 3.

Operation of the vertical channel FET will be explained with respect to FIG. 1 and FIG. 5, the latter showing a partially enlarged portion of the channel region of the vertical FET of FIGS. 3(a and b). The p$^+$-type layer 6 corresponds to the gate G of the V-FET and the n$^-$-type layer 2 beneath a gap w corresponds to a channel region of the V-FET. The depletion layer of the channel region varies as shown by broken lines when the gate voltage is varied.

When the bipolar transistor Tr is not in saturation condition, the base-collector junction is reverse biased, so the depletion layer extends to a region shown by a broken line which is identified as $V_{BE} < V_{CE}$. Therefore, the channel 20 between the gate 6 is closed, and no current flows between the source 2 and drain 8. Accordingly, the operation of the bipolar transistor Tr is not affected by the vertical channel FET. If the base voltage of the bipolar transistor is increased, the collector voltage decreases, and the depletion layer becomes thin, since the reverse bias voltage between collector and base (which corresponds to the gate voltage) decreases. And when the collector voltage becomes equal to the base voltage, the depletion layer retreats to a broken line which is identified as $V_{BE} = V_{CE}$. As shown in FIG. 1, though the depletion layer is thinned, the channel 20 is still closed, and no current flows between the base and collector of the bipolar transistor.

But if the collector voltage decreases further, the depletion layer shrinks as shown by a broken line which is identified as $V_{BE} > V_{CE}$. The channel 20 between the gate 6 is opened and the path between the source 2 and the drain 8 becomes conductive. Therefore, the bipolar transistor Tr is shunted at its base and collector by the V-FET, and the collector voltage cannot decrease further.

When the channel 20 of the vertical FET is opened and the vertical FET becomes conductive, its inner resistance becomes very small. Moreover, compared to a Shottky barrier diode, a vertical channel FET does not have a junction having a barrier potential so the voltage drop between the source and drain of the V-FET is very small compared to the junction voltage of the Shottky barrier diode. As has been described above, the V-FET is automatically controlled by the built in potential of the bipolar of the transistor, and it is OFF (not in a conductive state) while the bipolar transistor is not in a saturation condition, but it becomes ON (a conductive state) when the bipolar transistor approaches the saturation condition. Thus the collector voltage of the bipolar transistor Tr is automatically clamped to a predetermined level before saturation begins. Therefore, the switching of the bipolar transistor from an ON to an Off state can be performed without the response time $\Delta T$, and the switching time $T_{off}$ is improved.

Such saturation control does not depend on the material used in the device. The adjustment of the control is done by designing the channel width w as shown in FIG. 5. The channel width does not depend on the choice of the material and it is perfectly designable compared to prior art devices using a Shottky barrier diode.

A detailed design of an embodiment of a bipolar transistor applying the present invention will be described. The bipolar transistor which can apply the present invention is a conventional one. For example, the n$^-$-type layer of the collector has an impurity concentration of $10^{14} \sim 10^{15}$/cm$^3$, the p-type base layer is $0.3 \sim 1.0$ μm thick having an impurity concentration of $10^{17} \sim 10^{18}$/cm$^3$, and the n$^+$-type emitter is $0.1 \sim 0.8$ μm thick having an impurity concentration of $10^{19} \sim 10^{20}$ cm$^3$. The channel width w of the V-FET in FIG. 4 is not so critical, it may be 1-2 μm. The n+-type layer 8 which becomes the drain of the V-FET, is 3 μm wide, and it can be fabricated together with the emitter of the bipolar transistor Tr using the same process.

In the above embodiment, the V-FET is formed in a window opened in the base contact region 6, as shown in FIG. 3(b). But it is not always necessary to open the window in the base contact region 6. As shown in FIG. 3(b) by a chain line, the base contact region may be divided into two parts 6 and 6'. But it will be clear for the one in the art that the cross section of such device is the same as that of FIG. 3(a), and the operation is quite the same.

The processes for fabricating the device of the present invention are conventional ones for fabricating ordinary bipolar transistors. Namely, conventional photolithography and diffusion or ion implantation, and any other processes may be applicable. Any conventional materials for fabricating the bipolar transistor may be used, i.e., silicon, gallium arsenide, etc. for the substrate, and any impurity dopant can be used such as boron, arsenic and phosphorus, etc. The electrode material may be of any kind such as aluminum, gold, polysilicon and so on. The surface of the device is coated with a passivation layer such as phospho-silicate glass. Description of such processes are omitted for the sake of simplicity.

It should be pointed out that, in any case, the masking process of the photolithography for the present invention is simplified compared to that of prior art using Shottky barrier diode. As can be seen in FIG. 3(a), the drain region 8 of the V-FET, the emitter region 7 and collector region 4 are all n+-type layers. The windows opened in the silicon dioxide layer 12 through which the n-type impurity is doped can be formed at the same time with a single photolithographic mask. The doping of the n+-type impurity for the drain region 8 and the emitter region 7 can be done at the same time by diffusion or ion implantation. Of course, at the same time, the collector contact region may also be doped, but since the collector is an n+-type region, it is never affected by such doping.

On the contrary, in a prior art device using a Shottky barrier diode, the n+-type layer 8 should not be formed, and the base electrode metal 11 should directly contact the n−-type collector region 2. Accordingly, the window for the base contact region 6 in the silicon dioxide layer 12 must be covered while the emitter region is doped (by diffusion or ion implantation). And when the electrode for the Shottky barrier diode (which corresponds to the electrode 11) is fabricated (usually it is formed by sputtering of metal), the opening for the base and collector contact in the silicon dioxide layer 12 must be covered. As mentioned before, a special material must be used. Therefore, at least one photolithographic process and mask is eliminated by the present invention.

In the above disclosure, the discription has been provided with respect to an npn type bipolar transistor, but it will be easy for the one skilled in the art to apply the invention to a pnp type transistor merely varying the type of the impurity dopant and conductivity type of the substrate. It will also be apparent that the invention is applicable not only for single transistors, but it can be applied to complementary transistors having pnp and npn transistors, or it may by applied to integrated circuits (IC).

As has been described, by applying the present invention, the switching off time of a bipolar transistor is improved, and the process for fabricating it becomes simplified and designable.

What is claimed are as follows:

1. A bipolar transistor having a base, collector and emitter and comprising:
   a vertical channel field effect transistor (V-FET) fabricated between the base and collector of the bipolar transistor, having a gate and a drain connected to the base of the bipolar transistor and having a source connected to the collector of the bipolar transistor; and
   said V-FET becoming conductive to clamp a voltage on the collector of the bipolar transistor so as not to be less than a predetermined voltage, for preventing a saturation condition of the bipolar transistor.

2. A bipolar transistor according to claim 1, wherein the bipolar transistor has a base contact region fabricated in a collector region of the bipolar transistor, said base contact region having an opening at a central portion thereof, and wherein said V-FET has a channel region fabricated between said opening and in said collector region of the bipolar transistor.

3. A bipolar transistor according to claim 1, wherein the thickness and impurity concentration of said emitter region and said drain region being substantially equal to each other.

4. A bipolar transistor according to claim 1, wherein said base contact region being separated into two parts at its center portion by a gap having a width corresponding to the width of said opening.

5. A bipolar transistor comprising:
   a substrate,
   a collector region formed in said substrate and having a first conductivity type;
   a base region formed in said substrate and having a second conductivity type opposite that of the first conductivity type, said base region being fabricated in said collector region;
   an emitter region formed in said substrate, having the first conductivity type and having a higher impurity concentration than that of said collector region, said emitter region being fabricated in said base region;
   a base contact region formed in said substrate, having the second conductivity type and having a higher impurity concentration than that of said base region, said base contact region being fabricated in said collector region and contacting the side of said base region, said base contact region having an opening formed therein in a center portion thereof;
   a vertical channel field-effect transistor (V-FET), fabricated between said base and collector region of the bipolar transistor, having a gate and drain connected to said base region of the bipolar transistor, said V-FET including:
     a drain region having the first conductivity type and having a higher impurity concentration than that of said collector region, said drain region being fabricated in said opening of said base contact region, the thickness of said drain region being smaller than that of said base contact region;
     a channel region having the first conductivity type and formed in said collector region beneath said drain region and in said opening of said base contact region; and
     a common contact electrode formed on said drain region and said base contact region;
   said V-FET becoming conductive and clamping a collector voltage of the bipolar transistor to a predetermined voltage for preventing saturation of the bipolar transistor.

* * * * *

UNITED STATES PATENT AND TRADEMARK OFFICE
CERTIFICATE OF CORRECTION

PATENT NO. : 4,739,386
DATED : APRIL 19, 1988
INVENTOR(S) : TETSU TANIZAWA

It is certified that error appears in the above-identified patent and that said Letters Patent is hereby corrected as shown below:

```
Col. 6, line 20, "1," should be --5,--;

line 24, "1," should be --5,--.
```

Signed and Sealed this

Twentieth Day of September, 1988

Attest:

DONALD J. QUIGG

Attesting Officer

Commissioner of Patents and Trademarks